United States Patent [19]

Monk

[11] Patent Number: 4,583,203

[45] Date of Patent: Apr. 15, 1986

[54] MEMORY OUTPUT CIRCUIT

[75] Inventor: Trevor K. Monk, Bexley, England

[73] Assignee: Standard Telephones & Cables, London, England

[21] Appl. No.: 559,251

[22] Filed: Dec. 8, 1983

[30] Foreign Application Priority Data

Jan. 14, 1983 [GB] United Kingdom ............... 8301057

[51] Int. Cl.[4] .............................................. G11C 7/00
[52] U.S. Cl. .................................... 365/189; 365/208
[58] Field of Search ................ 365/189, 190, 207, 208

[56] References Cited

FOREIGN PATENT DOCUMENTS 1520078  8/1978  United Kingdom .

OTHER PUBLICATIONS

T. A. Green, "TTL-TO-MOS Driver", IBM Tech. Disclosure Bull. vol. 21, No. 3, Aug. 1978, pp. 1122-1123.

Primary Examiner—Joseph A. Popek
Attorney, Agent, or Firm—Kerkam, Stowell, Kondracki & Clarke

[57] ABSTRACT

An energy efficient output circuit for a static random access memory includes a pair of output transistors each driven by a bootstrapped driver stage. This requires less current than conventional amplifier chain.

4 Claims, 4 Drawing Figures

MEMORY OUTPUT CIRCUIT

This invention relates to semiconductor memories and in particular to output circuits for such memories.

Semiconductor memories, e.g. static random access memories, comprise an array of storage cells in which data is stored in the form of binary ones and zeros. Since the quantity of energy stored in an individual cell is extremely small it is essential to provide some means of amplification to effect read-out from the memory.

the standard output chain in a static memory consists of a number of cascaded amplifiers to boost the energy read from a cell. Only the final one or two stages are driven into a limiting condition in order to provide clearly defined logic levels at the output.

Figure 1:
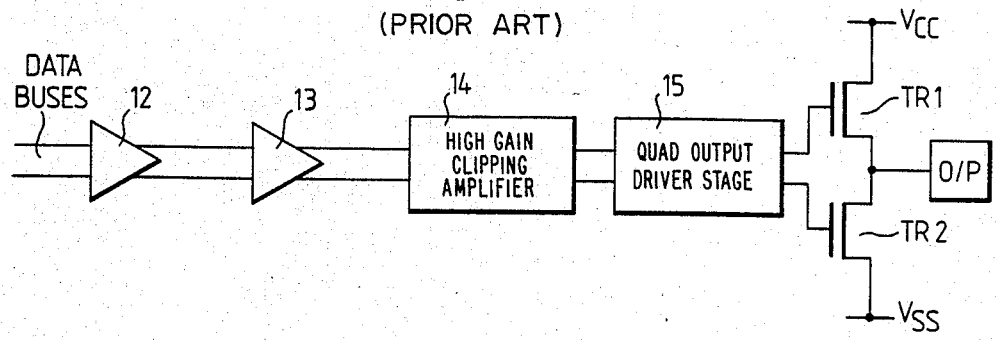

Referring to FIG. 1, which is typical of this kind of prior art constructions, the output chain comprises two or more preamplifiers 12 and 13 which feed a pair of output transistors TR1, TR2, via a high gain clipping amplifier 14 and a quad output driver stage 15. The output transistors present a high capacitive load, typically 2 pF, on the driver stage. To provide a high operating speed it is necessary for the driver stage to be a high current circuit. This in turn presents a large load to the clipping amplifiers. The overall design thus consumes excessive power and has a poor delay-power product.

The object of the present invention is to minimise or to overcome this disadvantage.

According to the invention there is provided in a semiconductor memory an output circuit including an output transistor series pair, each transistor of which pair is coupled to a respective bootstrapped driver circuit, and means for driving said bootstrapped driver circuits with signals corresponding to memory output data.

Figure 2:
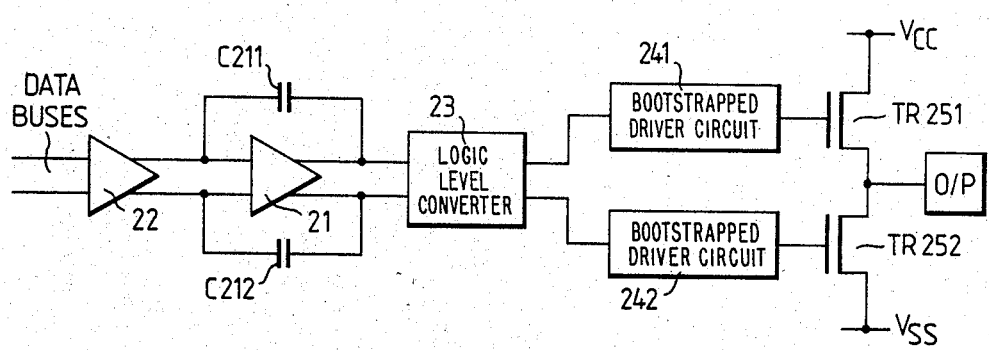
Figure 3:
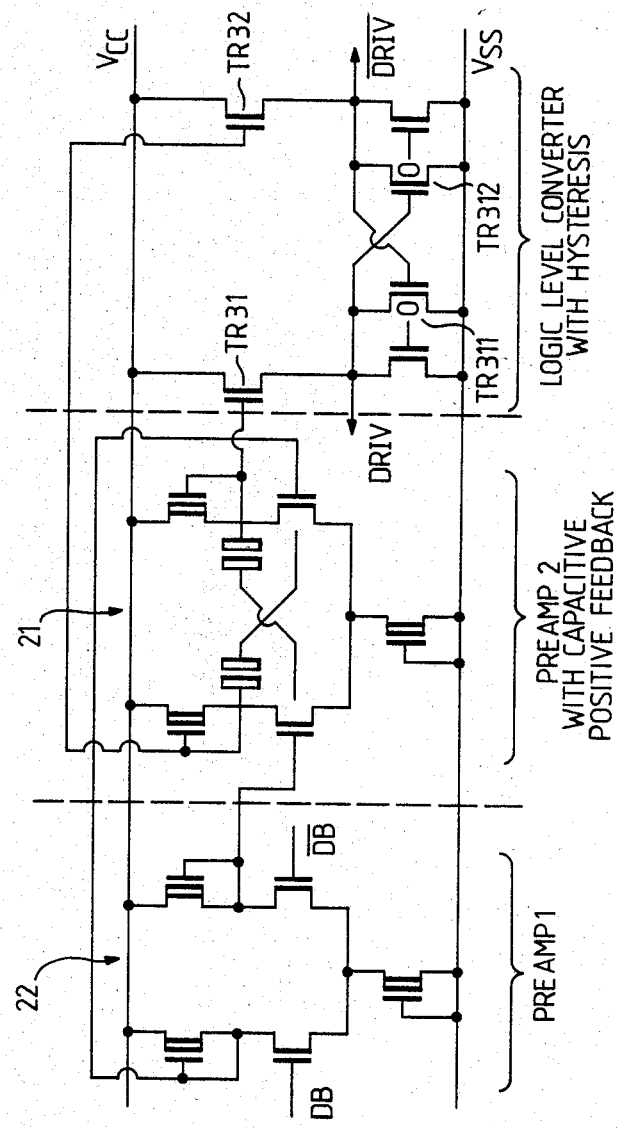
Figure 4:
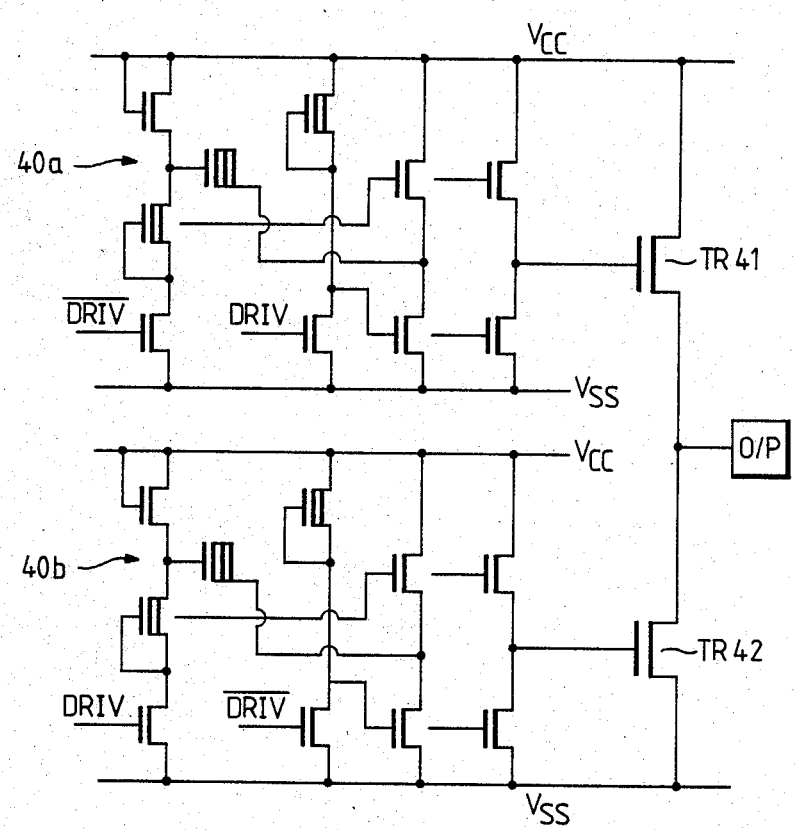

An embodiment of the invention will now be described with reference to FIGS. 2 to 4 of the accompanying drawings in which:

FIG. 2 shows in part schematic form an energy efficient output chain for a semiconductor memory:

and FIGS. 3 and 4 show the detailed circuitry of the output chain of FIG. 2.

Referring to FIG. 2, the memory output chain, which is fabricated typically in NMOS technology, comprises a preamplifier 21 provided with positive capacitive feedback via capacitors C211, C212 and coupled to the memory data buses via a first preamplifier or sense amplifier 22. The output of the preamplifier 21 is coupled via a logic level converter/gating circuit 23 to a pair of bootstrapped output driver circuits 241, 242. Each driver circuit drives a respective one of a series pair of output transistors TR251, TR252.

Bootstrapped driver circuits are used in this application as they are capable of driving the high capacitive loads presented by the gates of the output transistors whilst consuming very low continuous supply current. Furthermore, these bootstrapped driver circuits present very little capacitive loading to the previous stage and may be controlled by a small input signal. Thus the constraints on preceding stages are significantly reduced.

It should be noted that the input or preamplifying stages depicted in FIG. 2 whereby the boostrapped stages are driven are shown by way of example only and that other input circuitry could be employed. However the particular arrangement shown is to be preferred as its power requirement is lower than many conventional circuits.

The circuitry of FIG. 2 is shown in some detail in FIGS. 3, 4. It should be noted that the associated power-down and gating circuitry, and some additional bootstrap assistance circuitry, has been omitted for clarity.

Referring to FIG. 3, the first input preamplifier (22) is fed by signals from a data bus pair DB, $\overline{DB}$. Differential voltages are amplified by the "long tail pair" configuration and applied to the inputs of the second preamplifier (21). This preamplifier is also arranged as a "long tail pair" but controlled positive feedback is used to improve signal rise and fall times. Typically, where the supply voltage Vcc is 5 volts, the differential output signal from the second preamplifier is of the order of 2 volts.

The purpose of the next stage is to convert these 2 volt differential voltages to a logic signal suitable for driving the bootstrapped circuits. Typically a suitable signal would have a logical zero level of less than 0.5 volts and have fast transitions between logic states. The driven cross-coupled arrangement shown in FIG. 3 fulfills these requirements and provides a logical one output level of the order of 3 volts with a 5 volt supply. The amount of hysteresis and the speed of transitions may be controlled by the ratio of dimensions between the enhancement and the natural transistors in the cross-couple. The outputs DRIV, $\overline{DRIV}$ go to the inputs of the bootstrap driver circuits shown in FIG. 4.

The logic level convertor of FIG. 3 comprises a pair of source follower transistors TR31, TR32 each provided with a source load comprising a further transistor 311, 312 or advantageously, two or more parallel connected transistors of different threshold voltages. These load transistors are cross-coupled and their sources are connected to the circuit ground.

Referring to FIG. 4, it may be seen that there are two bootstrapped driver circuits 40a, 40b, one for each output transistor TR41, TR42. Dimensions in each driver circuit may be optimised individually to match the different loads presented by each output transistor.

The configuration and operation of a bootstrapped driver circuit is described in detail in our published specification No. 1,520,078 (Obermeier 4). The circuit used in FIG. 4 differs from that of specification No. 1,520,078 in the use of depletion transistor loads and the provision of an extra inverter to permit fast operation from the 0/3 volt logic levels provided by the DRIV, $\overline{DRIV}$ input signals.

I claim:

1. In a semiconductor memory, an output circuit comprising:
    an output transistor series pair, each transistor of said pair being coupled to a respective bootstrapped driver circuit;
    driver means for driving said bootstrapped driver circuits with signals of a voltage level less than the operating voltage of the memory and corresponding to memory output data; and
    said driver means including a first preamplifier serving as a sense amplifier, a second preamplifier connected to the output of said first preamplifier and provided with positive capacitive feedback, and a logic level converter having an output pair of source follower transistors provided with cross-coupled load transistors, the sources of the load transistors being connected to circuit ground.

2. A circuit in accordance with claim 1, wherein each of said load transistors comprises a plurality of parallel-connected transistors having different threshold voltages.

3. A circuit in accordance with claim 1, wherein said first preamplifier, said second preamplifier and said logic level converter comprise balanced stages.

4. In a semiconductor memory, an output circuit fabricated by an NMOS process and comprising:
   an output transistor series pair, each transistor of said pair being coupled to a respective bootstrapped driver circuit;
   driver means for driving said bootstrapped drive circuits with signals of a voltage level less than the operating voltage of the memory and corresponding to memory output data; and
   said driver means including a first preamplifier serving as a sense amplifier, a second preamplifier connected to the output of said first preamplifier and provided with positive capacitive feedback, and a logic level connecter having an output pair of source follow transistors provided with cross-coupled load transistors, the sources of the load transistors being connected to circuit ground.

* * * * *